United States Patent [19]

Bernard et al.

[11] 4,255,465

[45] Mar. 10, 1981

[54] METHOD OF PRODUCING JOSEPHSON-EFFECT JUNCTIONS

[75] Inventors: Paul Bernard, Echirolles; Daniel Zenatti, Veurey, both of France

[73] Assignee: Commissariat a l'Energie Atomique, Paris, France

[21] Appl. No.: 499,007

[22] Filed: Aug. 20, 1974

[30] Foreign Application Priority Data

Aug. 28, 1973 [FR] France ................................ 73 31061

[51] Int. Cl.³ .......................................... H01L 39/22
[52] U.S. Cl. ........................................ 427/62; 29/599;
357/5; 427/63; 427/124; 430/318; 430/319
[58] Field of Search ............... 117/212, 217, 107, 227;
427/62, 63, 124; 29/599; 338/32 S; 307/245,
306; 430/318, 319

[56] References Cited

U.S. PATENT DOCUMENTS

| 3,204,211 | 8/1965 | Crittenden, Jr. et al. | 338/32 S |
|---|---|---|---|
| 3,251,715 | 5/1966 | Miles et al. | 338/32 S |
| 3,288,637 | 11/1966 | Ames | 117/217 |
| 3,335,363 | 8/1967 | Anderson et al. | 307/245 |
| 3,432,416 | 3/1969 | Rairden et al. | 29/599 |
| 3,436,258 | 4/1969 | Neugerbauer et al. | 117/107 |
| 3,493,475 | 2/1970 | Neugebauer et al. | 29/599 |

*Primary Examiner*—John D. Smith
*Attorney, Agent, or Firm*—Lane, Aitken, Ziems, Kice & Kananen

[57] ABSTRACT

This invention relates to a method of producing a Josephson-effect superconductive junction.

The method is characterised in that a superconductive refractory material is applied as a thin and uniform deposit to an insulating substrate, the deposit is defined to give it the form of a bridge between two studs of greater width than the said bridge, and in that the junction at very low temperature is subjected to at least one current pulse, the intensity and duration of which have a value dependent upon the required critical Josephson current.

A particular application of the invention is the production of a magnetometer.

5 Claims, 1 Drawing Figure

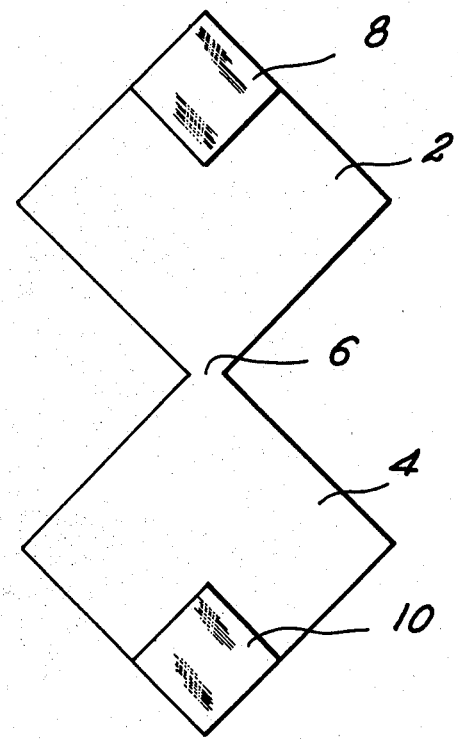

METHOD OF PRODUCING JOSEPHSON-EFFECT JUNCTIONS

This invention relates to a method of producing Josephson-effect junctions, and the junctions produced by this method.

The Josephson effect is obtained from a system comprising two layers of superconductive material, said two conductors either being connected by a very narrow conductive bridge or being separated by a layer of non-superconductive material. When this system is under superconductivity conditions, for example when immersed in liquid helium, the superconductive elements are loosely coupled and give rise to specific tunnel effect phenomena between two superconductive elements. On the one hand, without any voltage being applied to the terminals of the system, the junction produces a direct current, the maximum level (critical current) of which is very sensitive to the strength of the magnetic flux applied to the junction. On the other hand, when a bias voltage is applied to the junction, the junction produces not only a direct current, but also an alternating current, the frequency of which directly proportional to the bias voltage. Also, when the junction is subjected to an alternating signal, the relationship between the current and the junction voltage changes considerably. Despite a continuous increase in the current, the voltage at the junction terminals increases in discrete steps. The equation is generally:

$$V_o = (nhf_s)/2e$$

wherein $V_o$ is the voltage at the junction terminals, n is an integer, h is Planck's constant, and e the electron charge, $f_s$ being the frequency of the radiation to which the junction is subjected.

For further information on the Josephson effect reference may advantageously be made to the March 1971 issue of "Electronics" (Pages 38 to 46), and the "Journal of Applied Physics", Volume 39, No. 6 (May 1968), pages 2409 to 2502.

There are several types of junctions adapted to produce the Josephson effect.

(a) The point junction, which comprises a flat surface, for example of niobium, to which a point is applied having a radius of curvature of about 20 Å. The characteristics of this system, of course, depend on the quality of the contact which it has been possible to make; the resulting stability of the system is quite average and the contact must be adjusted after each return to ambient temperature (since the junction is immersed in liquid helium during operation).

(b) The Dayem bridge, which consists of two very thin superconductive films (500 Å) interconnected by a small constriction or bridge ($1\mu \times 1\mu$). These systems have excellent stability but the difficulty is in the process of making the junction because it is impossible reproducibly to make constrictions having such dimensions by means of conventional techniques: photomasking or mechanical masking. The solutions proposed heretofore do not enable bridges of defined characteristics to be produced, for example bridges with defined Josephson critical currents, with a high degree of accuracy.

(c) The Notarys bridge, which is a variant of the Dayem bridge, making use of the proximity effect and comprising making bridges which are longer ($25\mu$) and wider ($4\mu$) and then depositing perpendicularly to this bridge a strip of non-superconductive material which may have a fairly considerable length, but a width of $1\mu$. There are various difficulties in depositing this material if a conventional method is to be used.

To produce the Dayem bridge, for example, the main methods used are as follows:

The simplest method is to evaporate a continuous superconductive film and then define the required form by cutting this film by means of a very fine point. This is of course very complex and prevents series-production even on a small scale.

Another technique is to spread a fine strip of a special varnish over the substrate. This strip is then cut transversely using a micropoint. The superconductive material is then evaporated and then the varnish is removed in an ethyl alcohol bath by means of ultrasonics.

Another method is to stretch a $7\mu$ diameter tungsten wire over the substrate and effect a first evaporation of the superconductive material. The tungsten wire is replaced by a metal mask which defines a strip of $4\mu$ width perpendicular to the direction of the previously used wire and then the second evaporation-deposition operation is carried out.

The bridges obtained with these three methods have a similar form. The dimensions obtained vary substantially according to the junctions and the results observed are uncertain.

Another method is to evaporate the semiconductor material through a metal mask. This time the main problems are concerned with the production of the mask which must be machined from a thin sufficiently rigid material with good definition. The reproducibility of such a system is not excellent.

The present invention has as its object a method of producing Josephson junctions, and the Josephson junction produced by this method, which obviate the above disadvantages, more particularly by enabling such junctions to be series-produced on a small scale and the critical Josephson current of the junction to be adjusted with great reliability.

The method of producing a Josephson-effect junction is characterised in that a thin and uniform deposit of a superconductive refractory material is made on an insulating substrate, the said deposit is defined to give it the shape of a bridge between two studs of greater width than said bridge, and the said junction at a very low temperature is then subjected to at least one current pulse, the intensity and duration of which have a value which depends on the required Josephson critical current. Preferably, the bridge has dimensions contained between 5 and $30\mu$.

According to a preferred embodiment, the superconductive material is niobium, which is vacuum-deposited by evaporation, the substrate being kept at a temperature of the order of 400° C.

The method is therefore essentially characterised in that the bridge is initially given dimensions which are easily obtained by conventional photogravure and chemical attack techniques, but which do not give the resulting junction the Josephson-effect characteristics. The subsequent treatment, which comprises subjecting the junction to heating produced by a current pulse, enables this junction to be given characteristics such that it has a Josephson effect.

The present invention also relates to the junction produced by the above method, which is characterised in that it comprises an insulating substrate and, on this insulating substrate, a thin film of superconductive refractory material having the form of two studs connected by a bridge whose dimensions are contained between 5 and 30μ, and on each stud a deposit of conductive material serving for the implantation of the electrical connections.

BRIEF DESCRIPTION OF THE DRAWING

The invention will be more readily understood from the following description of one embodiment which is given by way of example without limiting force with reference to the accompanying single FIGURE which is a top plan view of one possible embodiment of a Josephson-effect junction.

As indicated hereinbefore, the production of a Josephson junction according to the invention comprises three main steps:

(a) Deposition of the uniform film of superconductive refractory material.

(b) Defining the shape of the said deposit.

(c) Treatment of the said deposit to give it Josephson-effect properties of given characteristics.

Niobium is used as refractory superconductive material in the following description, but of course other superconductive materials could be used, e.g. vanadium or tantalum. The technique remains the same in that case and all that is required is to adapt the figures specific to those materials.

However, it should be noted that although it is relatively difficult to obtain a thin film of niobium, this substance has the very important advantage of being particularly resistant to external agents such as humidity and temperature. At ambient temperature the deposition of the niobium film comprises the following steps:

(a) The substrates are cleaned and then placed in a vacuum enclosure on a heating substrate-carrier. The enclosure is then evacuated further by means of cryosorption pumps for the primary vacuum and an ion pump with a titanium sublimater for the secondary vacuum. Heating of the substrate is started when the vacuum is of the order of $10^{-7}$ torr, and is continued for 10 to 12 hours in such a manner as to give a high temperature of the order of 400° C. During this same period the substrate is protected and regular evaporation cycles are carried out to allow degassing of the niobium ingot. The niobium evaporated in this way is an excellent getter and will cover the walls of the chamber thus improving the limit vacuum (about $10^{-8}$ torr).

(b) Evaporation proper is then carried out and is controlled from a system for measuring the thickness of the deposit, based on the frequency variation of a quartz crystal. At this stage the vacuum is generally below $10^{-7}$ torr. A four-crucible gun of a power of the order 6 kW for example is used for this evaporation. The substrate is allowed to cool slowly.

(c) When it reaches a temperature of the order of 120° C., a layer of gold is evaporated which will be used for contacts on the resulting bridges. Evaporation is terminated, the vacuum enclosure is opened when the substrate is at a temperature of about 60° C.

The next step consists in defining the exact form of the niobium deposit. For this purpose it is possible advantageously to use a photomasking and chemical etching technique. The photomasking process is quite conventional. The chemical is effected as follows:

For each junction to be made on the substrate the resin after exposure and development has a similar form to that shown in the accompanying drawing. This comprises two squares connected by one of their corners. These squares have the reference 2 and 4 respectively, and the common corner which forms a constriction 6 between the two squares 2 and 4 gives the Josephson junction bridge. The rectangles 2 and 4 form the studs. By way of example, the squares 2 and 4 which could equally have some other form, have a side of 1 mm. The width of the bridge 6 in this example is 10μ. By way of example, it is possible to insulate and etch 36 patterns identical to that shown in the FIGURE on a 25 mm×25 mm substrate.

Etching of the top layer of gold and then the layer of niobium is then effected to this geometry and the forms of the junctions are now perfectly defined. The substrate is rinsed and dried. At this stage fresh resin is applied and this time it will be exposed through a new mask which defines the gold contact studs. The gold is eliminated everywhere other than on the studs 8 and 10 which are used as the electrical contacts. The substrate is then cut up (into 36 portions in this example); the junctions are ready for testing and adjusting by the following operation.

The object of this third step is, on the one hand, to give the junction produced in the second stage of the method the Josephson-effect properties which it does not yet have, and on the other hand to adjust the value of the corresponding critical current. This step may be termed low-temperature fast isochronous annealing in an inert medium.

This operation is carried out in a cryostat in a helium atmosphere just above the liquid helium bath in which the junction will subsequently be immersed to test its operation. This operation is therefore carried out at a temperature corresponding approximately to the return of the sample to the normal state, i.e. about 10° K. A current pulse whose amplitude and duration depend on the required Josephson critical current for the junction is then applied to the latter.

The transformation resulting from the foregoing treatment may be explained—without this explanation in any way affecting the validity of the patent—by a phenomenon corresponding substantially to fast annealing effected as follows:

The current pulse applied to the junction produces heating localised at the bridge where the current density is particularly high. When this pulse has stopped, the sample undergoes abrupt cooling due to the liquid helium. During the current pulse period, therefore, defects may be produced at the bridge and when the pulse has stopped these defects will immediately be fixed. This defect trapping results in an increase of the ohmic resistance of the junction in the normal state and a reduction of the critical temperature in the superconductive state.

Of course the complete treatment of a junction may require several of these operations to reach the required critical current value.

This method enables junctions to be made which have critical currents contained between 5 ma and 5 μa, in a relatively fine and quite reproducible and reliable manner. Junctions at present made by this method are not protected, they are subjected to very abrupt temperature cycles, the return to ambient temperature generally being effected very rapidly. With regard to storage at ambient temperature, for which no specific precaution has been taken, no aging phenomenon has been found over a period of about eight months.

This method therefore enables dimensional problems to be overcome, this having been verified several times, the tests having covered junctions whose bridges have a width contained between 10 and 20μ, and for which there is no photomasking problem.

Josephson junctions have numerous applications amongst which we may cite magnetometers. In this area, a junction having a very low critical current is inserted in a superconductive ring and in practice this comprises etching the depositing niobium on a small-diameter cylinder. The theoretical limit sensitivity of such an element is of the order of $10^{-11}$ gauss.

A system of this kind can also be used for measuring small currents and the measurements arising therefrom; resistivity, voltage and inductance measurement in particular. An apparatus of this kind also has applications in microwaves because such junctions are microwave generators and sub-millimeter wave generators. They may also be used as microwave and submillimeter wave receivers. It should be noted that there are no other types of detector in the far infrared. They may also be used in radio-astonomy.

Systems of this kind may also be used in spectrometry to detect nuclear magnetic resonance of radioactive substances.

We claim:

1. A method of producing Josephson-effect junctions characterised in that a thin and uniform deposit of a superconductive refractory material is made on an insulating substrate, the said deposit is defined to give it the shape of a bridge between two studs of greater width than said bridge, and the said junction at a very low temperature is then subjected to at least one current pulse to change the said deposit from a condition in which said deposit does not exhibit the Josephson-effect to a condition in which said deposit exhibits the Josephson effect, said bridge having dimensions such that prior to application of said current pulse said deposit does not exhibit the Josephson effect.

2. A method according to claim 1, characterised in that the bridge has a width contained between 5 and 30 microns.

3. A method according to claim 1, characterised in that the superconductive material is niobium which is vacuum-deposited by evaporation, the substrate being kept at a temperature of about 400° C.

4. A method according to claim 1, characterised in that after deposition of superconductive material a layer of conductive metal is deposited over the superconductive material.

5. A method according to claim 1, characterised in that the deposit of superconductive material and the metal deposit are defined by photomasking and chemical etching so that the metal deposited is left only at two electrical contacts.

* * * * *